(12) United States Patent
Kobinata

(10) Patent No.: US 6,741,733 B1
(45) Date of Patent: May 25, 2004

(54) DRAWING PATTERN VERIFYING METHOD

(75) Inventor: Hideo Kobinata, Tokyo (JP)

(73) Assignee: NEC Electronics Corporation, Tokyo (JP)

( * ) Notice: Subject to any disclaimer, the term of this patent is extended or adjusted under 35 U.S.C. 154(b) by 747 days.

(21) Appl. No.: 09/709,290

(22) Filed: Nov. 13, 2000

(30) Foreign Application Priority Data

Nov. 12, 1999 (JP) ............................................. 11-323382

(51) Int. Cl.$^7$ ................................................. G06K 9/00
(52) U.S. Cl. .......................... 382/149; 382/144; 716/19
(58) Field of Search ................................ 382/149, 144; 716/19, 21; 250/492.2, 492.3; 430/5, 22; 378/34, 35

(56) References Cited

U.S. PATENT DOCUMENTS

| | | | | |
|---|---|---|---|---|
| 5,051,585 A | * | 9/1991 | Koshishiba et al. | 250/306 |
| 5,130,213 A | * | 7/1992 | Berger et al. | 430/4 |
| 5,393,988 A | * | 2/1995 | Sakamoto | 250/492.22 |
| 5,451,487 A | * | 9/1995 | Abe et al. | 430/296 |
| 5,717,204 A | * | 2/1998 | Meisburger et al. | 250/310 |
| 5,770,336 A | * | 6/1998 | Choi | 430/5 |
| 5,789,119 A | * | 8/1998 | Okino | 430/5 |
| 5,804,339 A | * | 9/1998 | Kim | 430/5 |
| 5,892,224 A | * | 4/1999 | Nakasuji | 250/310 |
| 5,905,267 A | * | 5/1999 | Muraki | 250/492.22 |
| 5,917,579 A | * | 6/1999 | Miyajima | 355/53 |
| 6,546,543 B1 | * | 4/2003 | Manabe et al. | 716/21 |

* cited by examiner

Primary Examiner—Samir Ahmed
(74) Attorney, Agent, or Firm—Sughrue Mion, PLLC

(57) ABSTRACT

An extraction region other than its mask holes is divided into a plurality of portions according to predetermined rules, in such a way that the mask holes are set to variable {2} and the portions thus divided except the mask holes are set to a variable {0} or {1}, thereby specifying variables a={0}, {1}, {2}. Then, scanning is performed in both X-axis and Y-axis directions, to divide a portion of variable {1} into a plurality of portions, to each of which is set any one of variables {0, 1, 2} which is determined on a basis of likelihood of defectiveness of its own, so that subsequently the variable of portions of variable {1} is reviewed on the basis of its likelihood of defectiveness. Specifically, a portion whose variable is set to {1} finally and also which has a variable permutation of {2} →{1} →{2} in its adjoining both-side portions is detected as a donut problem occurrence portion and the other portions are detected as a leaf problem occurrence portions.

17 Claims, 9 Drawing Sheets

16: rectangular pegion
15: leaf pattern

19: portion
18d  18a
19
20
18b
18c
18: donut pattern

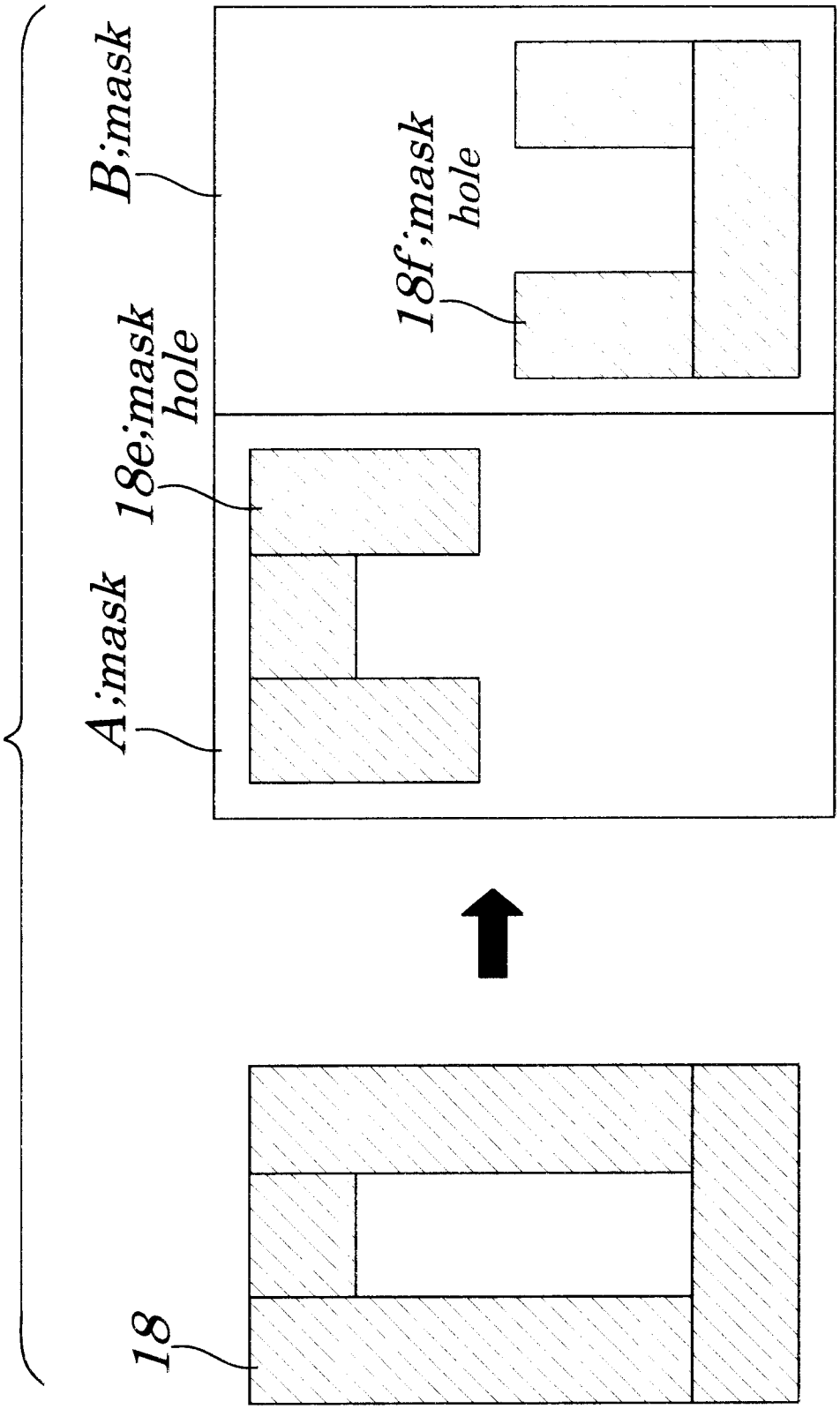

S1 ~ S7; peripheral graphic
201 ~ 206; slant pattern
200; extraction region

230; extraction region
231, 235, 236; leaf pattern
232, 233, 234; donut pattern

DRAWING PATTERN VERIFYING METHOD

BACKGROUND OF THE INVENTION

1. Field of the Invention

The invention relates to a drawing pattern verifying method for verifying a drawing pattern of a mask for drawing a circuit pattern as a set of fine patterns of a semiconductor device and, more particularly, to a drawing pattern verifying method by use of partial or overall batch transfer employing a stencil mask.

The present application claims priority of Japanese Patent Application No. Hei11-323382 filed on Nov. 12, 1999, which is hereby incorporated by reference.

2. Description of the Related Art

There is put to practical use such a micro-lithography technology that, in steps of manufacturing semiconductor devices, utilizes a focused beam of such a charged particle beam as an electron beam (EB), ion beam, or a like, in order to draw integrated circuit patterns. For example, by one of such technologies, a relevant electron beam exposure apparatus applies the electron beam to a wafer coated with an electron beam-sensitive resist to directly project integrated circuit patterns to the wafer, by using an EB mask in order to obtain a required drawing pattern by use of the electron beam. Such an electron beam drawing technology by use of the electron beam comes in a partial batch exposure method or an overall batch exposure method, by either of which a mask pattern is reduced and projected to a give batch drawing of unit regions such as a memory cell. These two methods both use two masks usually, to shape the electron beam into a rectangular one by using a first mask and then apply this rectangular electron beam to a second mask. The second mask previously has a plurality of rectangular cell apertures on which is formed a partial pattern cut out of a drawing pattern to be projected to a wafer, so that these cell apertures are reduced several ten-fold through an electric optical system and then transferred to the wafer in batch exposure. These partial and overall batch exposure methods are superior to the variable shaped beam approach not only in a respect of an improved throughput due to a decrease in a number of projections required but also in a respect of such improvements in inter-projection connecting accuracy, slant pattern image quality, and pattern data compressibility that, for example, may have no direct influences on wafer drawing time even with finer patterning.

In addition, there is available as a lithography apparatus employing the ion beam such the ion beam transfer exposure apparatus, by which the mask pattern is projected in transfer to the wafer using the ion beam like the electron beam lithography apparatus. This method can provide batch projection of all chip patterns in transfer by using the ion beam to realize a higher throughput while maintaining a high resolution of ion beam exposure. This ion beam transfer method comes in such an approach that arranges the mask with patterns formed thereon near the wafer to thereby apply a large-diameter ion beam to the mask so that the transmitted ion beam may transfer these patterns or a reduction-projecting exposure approach that applies the ion beam to a five-fold or ten-fold sized mask to thereby perform reduction-projecting exposure of patterns onto the wafer.

The above-mentioned electron beam drawing technology uses two types of masks in batch exposure whereby circuit patterns are collectively projected to the wafer: a stencil mask having holes therein through which the electron beam passes to draw circuit patterns and a membrane type mask having a membrane for blocking the electron beam to do so.

In the case of the stencil mask, any region surrounded entirely by mask holes cannot have a portion thereof to support itself, so that such the stencil mask cannot be manufactured, which is hereinafter referred to as a donut problem. On the other hand, in a region surrounded largely by mask holes except a slight peripheral supporting portion thereof, as the portion entirely surrounded by the mask holes is much larger than the supporting portion, the slight peripheral supporting portion has a lower strength, so that when the transfer mask is made, this inner portion may be warped or deformed, which is hereinafter called a leaf problem. With this, to avoid such the donut problem and the leaf problem during manufacturing of transfer masks for drawing patterns, the mask must be checked to detect such problems manually or by use of pattern continuity so that any regions having thus detected problems may undergo application of the membrane type mask or division of patterns.

Manual detection, however, suffers from a problem of possibly creating large-scale pattern defects due to human error. The method of detecting isolated patterns by checking pattern continuity, on the other hand, suffers from a problem that it can detect only such regions that have the donut problem, so that it needs to use a separate program for the leaf problem.

SUMMARY OF THE INVENTION

In view of the above, it is an object of the invention to provide a drawing pattern verifying method for verifying drawing patterns created on a stencil mask that can use a same algorithm to detect patterns suffering from a donut problem or a leaf problem.

According to an aspect of the present invention, there is provided a drawing pattern verifying method for verifying a drawing pattern to be formed on a stencil mask used in electron beam exposure or ion beam exposure, including steps of:

extracting the drawing pattern from device designing data;

dividing a region in which the extracted drawing pattern is arranged except mask holes into a plurality of portions;

setting to each of divided portions a variable of a plurality of kinds of variables which are determined based on likelihood of defectiveness of the portions; and reviewing a specific variable of the portion based on likelihood of defectiveness thereof.

With the foregoing aspect, since the region except mask holes providing openings in an area for arranging the drawing pattern therein is divided into a plurality of portions so that each of these divided portions may have the variable set thereto based on its own defect occurrence likelihood, such the portion that has the specific variable which is set finally thereto when these variables are reviewed can be identified to be a defective portion, thus previously detecting the region subject to pattern defect occurrence.

In the foregoing aspect, a first preferable mode is one wherein the reviewing step includes steps of:

further dividing the portion with the specific variable into the plurality of portions; and setting to each of the portions the variable which is determined based on likelihood of defectiveness thereof; and the further dividing step and the setting step are repeated once or a plurality of times.

With the first preferable mode, if the portion of the specific variable cannot be specified as a pattern occurrence portion when it is reviewed, the variable can be reset to verify even more complicated drawing patterns of the portion.

Also, a second preferable mode is one wherein the portion of a finally set specific variable is a first defective portion entirely surrounded by mask holes and/or a second defective portion partially surrounded by mask holes.

With the second preferable mode, it is possible to extract both the first defective portion which provides the donut problem and the second defective portion which provides the leaf problem, by using a same algorithm.

Also, a third preferable mode is one wherein the variable setting step specifically sets variables a={a0}, {a1}, {a2} (where, a0≠a1≠a2) according to rules, the rules including:

a first rule for setting to a third portion an inner portion surrounded by straight lines which are in contact with the mask hole nearest to the region arranged in the drawing pattern and which are parallel with sides of the region and also setting an outside of the third portion to variable {0}, mask holes to variable {a2}, and remaining to variable {a1};

a second rule for performing first scanning on the region in X-axis and Y-axis directions, to set to variable {a0} such a portion of the variable {a1} that becomes of any selected one of variable permutations of {a0}→{a1}→{a2}, {a2}→{a1}→{a0}, and {a0}→{a1}→{a0} observed in the portion of the variable {a1} and adjoining both-side portions thereof as a result of scanning in both directions; and a third rule for performing second scanning on the region in X-axis and Y-axis directions, to set to variable {a0} such a portion of variable {a1} that becomes of a variable permutation of {a0}→{a1}→{a0} observed in the portion of variable {a1} and adjoining both-side portions thereof as a result scanning in one or both of X-axis and Y-axis directions, and then performing third scanning in X-axis and Y-axis directions for setting in a same way as the second scanning; and the specific variable is {a1}.

Also, a fourth preferable mode is one wherein the variable setting step specifically sets variables a={a0}, {a1}, {a2} (where, a0≠a1≠a2) according to rules, the rules including:

a fifth rule for setting sides of a region in which the drawing pattern is arranged to variable {a0}, mask holes to variable {a2}, and remaining to variable {a1};

the second rule 2 for performing first scanning on the region in X-axis and Y-axis directions, to set to variable {a0} such the portion of the variable {a1} that becomes any selected one of variable permutations of {a0}→{a1}→{a2}, {a2}→{a1}→{a0}, and {a0}→{a1}→{a0} observed in the portion of the variable {a1} and adjoining both-side portions thereof as a result of scanning in both directions; and the third rule for performing second scanning on the region in X-axis and Y-axis directions, to set to variable {a0} such the portion of the variable {a1} that becomes of a variable permutation of {a0}→{a1}→{a0} observed in the portion of the variable {a1} and adjoining both-side portions thereof as result of scanning in one or both of X-axis and Y-axis directions, and then performing third scanning in X-axis and Y-axis directions for setting variables in the same way as the second scanning; and the specific variable is {a1}.

Also, a fifth preferable mode is one wherein the rules further includes:

a fourth rule for, after the third rule is applied, performing final scanning in X-axis and Y-axis directions, to detect as the first defective portion such a portion of variable {a1} that becomes of a variable permutation of {a2}→{a1}→{a2} observed in the portion of variable {a1} and adjoining both-side portions thereof as result of scanning in both x-axis and y-axis directions and to detect as the second defective portion such the portion of variable {a1} that becomes of a variable permutation of {a2}→{a1}→{a2}, observed in the portion of variable {a1} and adjoining both-side portions, as result of scanning in either one of X-axis and Y-axis directions and of {a0}→{a1}→{a2} or {a2}→{a1}→{a0} as result of scanning in the other direction, thus detecting the portion of variable {a1} as the first defective portion or the second defective portion.

With the fifth preferable mode, it is possible to extract not only the donut problem or leaf problem occurrence region but also such the portion that only its mutually facing two sides are in contact with mask holes but other two sides not in contact with the mask hole are too short to support this variable {a1} portion so that it may give rise to a defect during the manufacturing of the stencil mask.

Also, a sixth preferable mode is one wherein when an aspect ratio of the second defective portion is smaller than a first threshold value, variable a of the second defective portion is reset from {a1} to {a0}.

With the sixth preferable mode, even if a shape is not clear beforehand that gives rise to the leaf problem, the first threshold value can be provided to thereby make setting arbitrarily whether a relevant portion is to be extracted as the leaf problem occurrence portion or not.

Also, a seventh preferable mode is one wherein the aspect ratio of the second defective portion is a magnitude of L2/L1, where L1 represents a length of such a side of the second defective portion that is in contact with a portion of variable {a0} and L2 represents a distance between a straight line passing through the side and a contact point, which is most distant in a direction perpendicular to the straight line, of the second defective portion and the portion of variable {a2}.

Also, an eighth preferable mode is one wherein by the second and third rules, the portion of variable {a1} which becomes of a variable permutation of {a0}→{a1}→{a0}, observed in the portion of variable {a1} and adjoining both-side portions thereof, as result of scanning in either of X-axis and Y-axis directions and of a variable permutation of {a0}→{a1}→{a2} as result of scanning in the other direction remains as of variable {a1} and is detected as a fourth defective portion if a value of L4/L3 is larger than a second threshold value, where L4 represents a length of a side of the portion of variable {a1} that is in contact with variable {a2} and L3 represents a length of a side of the portion of variable {a1} that is in contact with variable {a2}.

Also, a ninth preferable mode is one wherein the variable setting step specifically sets variables a={a0}, {a1}, {a2} (where, a0≠a1≠a2) according to rules, the rules including:

The first rule for setting to a third portion such a portion that is surrounded by straight lines which are in contact with a mask hole nearest to a side of a region in which the drawing pattern is arranged and which are parallel with sides of the region and also setting a portion outside the third portion to variable {a0}, mask holes to variable {a2}, and the remaining to variable {a1};

a sexth rule for extracting the portion of variable {a1} which is in contact with the portion of variable {a0} and which contains a single portion of variable {a2};

a seventh rule for forming a graphic which is in contact with a side of the portion of variable {a2} and which has a predetermined width, thus setting a variable for the graphic; and an eighth rule for dividing variables of the extracted portion of variable {a1} based on the graphic, thus setting variables; and the specific variable is {a1}.

With the ninth preferable mode, since the graphic can be formed along the side of the mask hole and set to the variable, the region in which the drawing pattern is arranged becomes rectangular typically, so that even when the drawing pattern is complicated due to, for example, oblique arrangement with respect to that side, the defective portion can be verified and extracted.

Also, a tenth preferable mode is one wherein the sixth, seventh and eighth rules are performed as many as number of variable {a2} provided.

Also, an eleventh preferable mode is one wherein the graphic formed according to the seventh rule is specifically formed in a priority order of a first graphic which is in contact with the portion of variable {a2}, which has a predetermined width, and which has opposite ends thereof in contact with the portion of variable {a0}, a second graphic which is in contact with a side of the portion of variable {a2}, which has a predetermined width, and which has one end thereof in contact with the portion of variable {a0} and the other end thereof in contact with the first graphic, and a third graphic which is in contact with a side of the portion of variable {a2}, which has a predetermined width, and which has opposite ends thereof in contact with the first graphic or the second graphic.

Also, a twelfth preferable mode is one wherein the first through third graphics formed are only such graphics that are in contact with a side of the portion of variable {a2} without a corner thereof or that are in contact with a side of the portion of variable {a2} with one corner thereof, the graphics without a corner thereof having priority over the graphics with a corner in formation.

Also, a thirteenth preferable mode is one wherein an angle of the corner of the first through third graphics with respect to the portion of variable {a2} is less than 270°.

With the thirteenth preferable mode, even a triangular region which has its two sides sandwiched by mask holes can be extracted as the defect occurrence portion.

Also, a fourteenth preferable mode is one wherein that further including a ninth rule for detecting the portion of variable {a1} which is in contact with none of the first through third graphics as a fifth region and the portion of variable {a1} which is in contact with any one of the first through third graphics as a sixth region, thus detecting portions of variable {a1} as the fifth portion or the sixth portion.

Also, a fifteenth preferable mode is one wherein the variable {a1} is reset to the variable {a0} if aspect ratio of the sixth portion is less than the third threshold value.

Also, a sixteenth preferable mode is one wherein the aspect ratio of the sixth portion is given as L6/L5, where L5 represents a length of a side of the sixth portion which is in contact with any one of the first to third graphics and L6 represents a length of a distance between a straight line passing through the side and a contact point, which is the most distance from the straight line in a direction perpendicular thereto, of the portion of variable {a1} and the portion of variable {a2}.

With configuration of the above, it is capable of detecting those portions to which the specific variables are set finally as a donut problem or leaf problem occurrence site beforehand, to perform special processing on masks having such a drawing pattern thereon, thus forming patterns in a stable manner.

Although the device pattern may come in a variety of kinds of patterns and it is extremely difficult to detect donut problem or leaf problem occurrence sites by visual inspection, with applying rules of setting variables, it is capable of simultaneously detecting the donut problem and leaf problem occurrence sites by using a single processing algorithm, and grasping the leaf problem occurrence sites. In addition, it is capable of assuming the leaf problem occurrence sites, based on a threshold value set in advance.

BRIEF DESCRIPTION OF THE DRAWINGS

The above and other objects, advantages and features of the present invention will be more apparent from the following description taken in conjunction with accompanying drawings in which:

FIG. 5 is a schematic top view showing another method for avoiding the donut problem-subject region in the stencil mask;

DESCRIPTION OF THE PREFERRED EMBODIMENTS

Best modes of carrying out the present invention will be described in further detail using various embodiments with reference to the accompanying drawings.

First Embodiment

Figure 1:
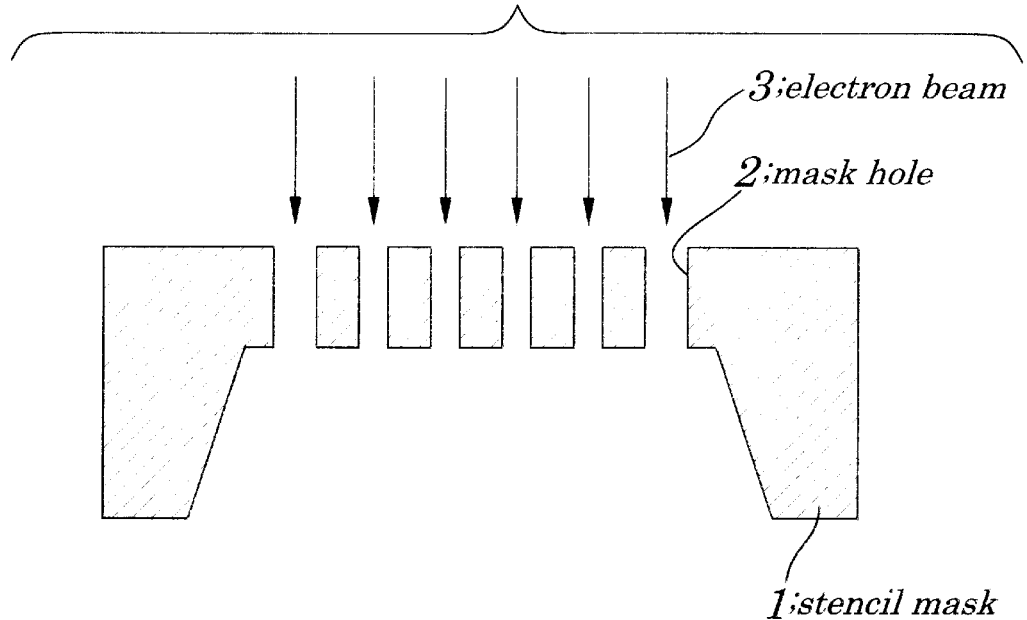
FIG. 1 is a schematic cross-sectional view showing a mask in a case of partial batch exposure and in a case of overall batch exposure.

As shown in FIG. 1, in both cases of partial batch exposure and overall batch exposure, an electron beam 3 is applied through mask holes 2 in a stencil mask 1, to form a pattern on a resist (not shown) on a silicon substrate or a like arranged below. Such the stencil mask 1 is typically formed by etching a mask hole forming region in a silicon oxide film o a like. stacked on the silicon substrate to make the mask hole 2. In the stencil mask 1, therefore, the above-mentioned donut problem or leaf problem occurrence pattern shaped mask hole cannot be formed.

Figure 2:
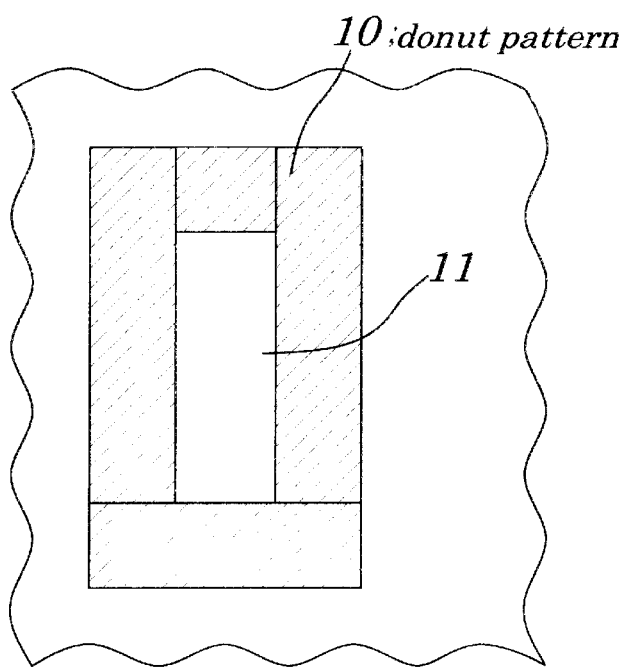
FIG. 2 is a schematic top view showing a donut pattern.

As shown in FIG. 2, a donut pattern 10 consists essentially of a mask hole including all the four sides surrounding a rectangular region 11. In this pattern, therefore, there is no portion supporting the rectangular region 11 in which a non-exposure portion is formed in a middle of the mask hole, so that such a donut problem occurs that when a stencil mask is formed, such a donut pattern 10 cannot be created that consists essentially of a blanked-out pattern completely surrounded by such the mask hole.

Figure 3:
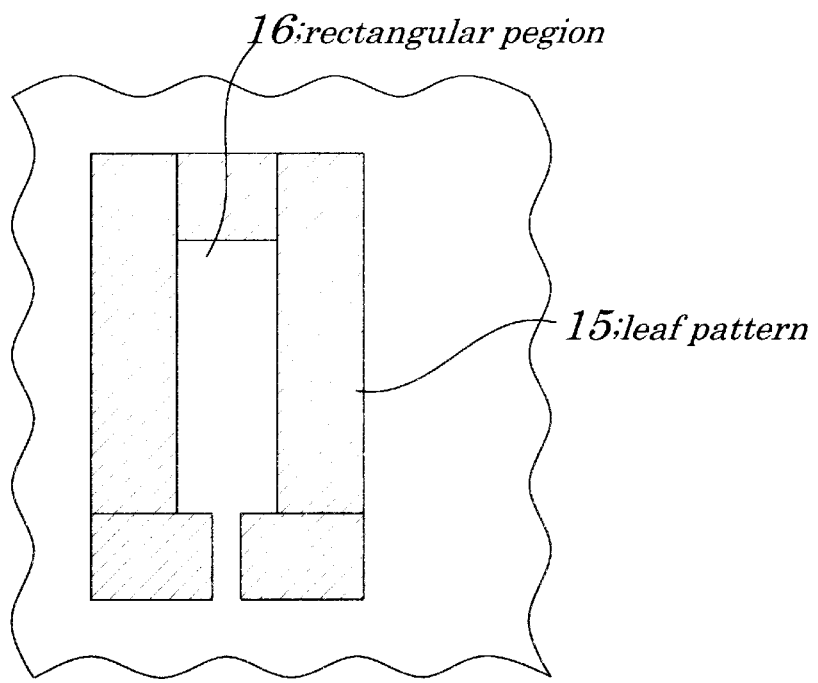
FIG. 3 is a schematic top view showing a leaf pattern.

As shown in FIG. 3, on an other hand, a leaf pattern 15 consists essentially of a mask hole including an entire periphery, except a slight portion, of a rectangular region 16. Thus, only one portion supports the rectangular region 16 with its other periphery all surrounded by the mask hole, so that if this portion supporting the rectangular region 16 is significantly smaller than the rectangular region 16, it cannot completely stand a weight of the rectangular region 16, thus giving rise to the leaf problem of deformation of fall-off of the stencil mask in this region rectangular 16. Therefore, any of the following methods must be employed to avoid such a problem.

Figure 4:
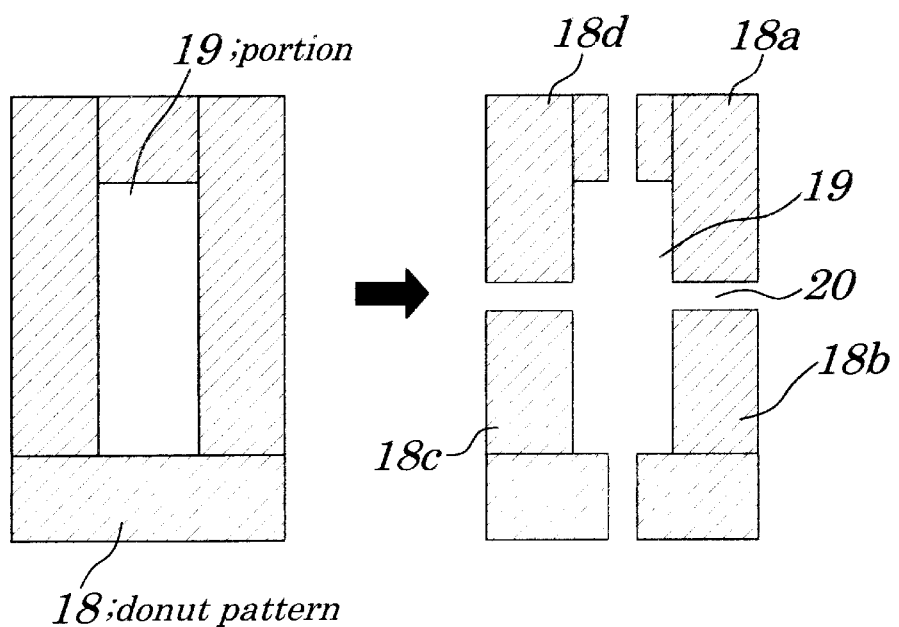
FIG. 4 is a schematic top view showing a method for avoiding a donut problem-subject region in a stencil mask.

FIG. 4 indicates a joisting method for providing a post by cutting a portion of a donut pattern. As shown in FIG. 4, a rectangular donut pattern 18 has a portion 19 formed therein which is subject to a rectangular donut problem. In this state, the donut pattern 18 cannot be formed, so that to guard against this a post 20 is provided in each of four sides of the donut pattern 18 to divide the donut pattern 18 into four mask holes 18a through 18d.

FIG. 5, on the other hand, shows a method for forming a mask complementary to the donut pattern. As shown in FIG. 5, the donut pattern 18 is bisected in a direction perpendicular to a longitudinal direction, to divide the donut pattern 18 into mask holes 18e and 18f made in complementary masks A and B respectively. Thus, such special processing can be performed to avoid the donut problem that divides the pattern into the separate masks A and B of mask holes 18e and 18f, which are combined to draw the donut pattern 18. According to the invention, relevant regions are scanned to set a variable for each of these regions in order to perform special processing such as joisting or complementary mask forming, so as to detect any of these regions subject to the above-mentioned donut or leaf problem to be solved by avoiding pattern defect.

The following will describe a method for verifying drawing patterns according to the embodiment.

In this embodiment, a drawing pattern to be formed by electron beam exposure or ion beam exposure on a stencil mask used is extracted from device design data, after which variables a={a0}, {a1}, {a2} (where, a0≠a1≠a2), for example variables a={0}, {1}, {2} in the embodiment are set to the pattern according to rules described later, thus beforehand detecting any regions which may be a problem when the stencil mask is created.

The following will describe the rules for defining: the variable.

Figure 6A:
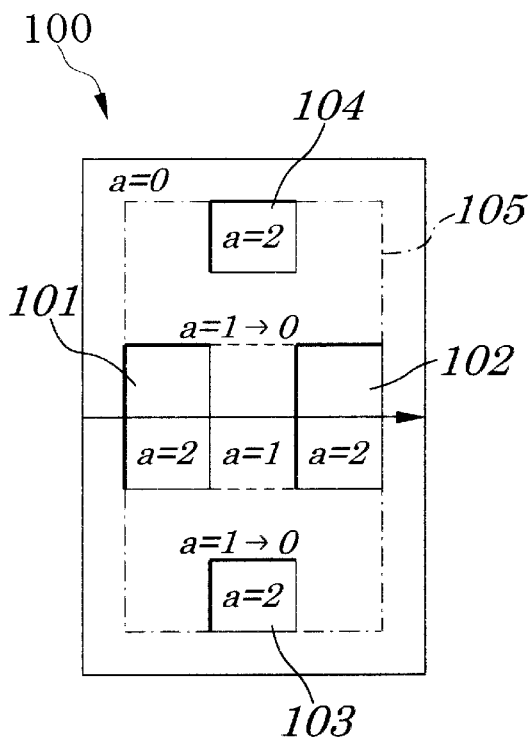
FIGS. 6A, 6B, 6C and 6D are schematic top views showing a method for applying rules 1 through 5 to the stencil mask.

FIG. 6A is a top view showing an extraction region 100 of a drawing pattern to be formed on a stencil mask extracted from device design data. As shown in FIG. 6A, the extraction region 100 has separate portions called mask hole 101 and 102 formed therein with a distance therebetween where a mask hole which provides an opening in the stencil mask is to be formed, between which portions are formed in a lower mask hole 103 and an upper mask hole 104 which have a same shape and both of which are distant from the mask holes 101 and 102 respectively in a Y-axis direction. The mask holes 101 and 102 are rectangular in parallel with the Y-axis and have the same shape.

First, according to a rule 1, an inner region surrounded by straight lines parallel with sides of the extraction region which lines are in contact with the mask hole nearest to the sides of the extraction region is defined to be a third portion, so that outside of this third portion in the extraction region is set as, for example, variable {0}, inside of the third portion except the mask holes is set as, for example, variable {1}, and the mask hole is set as, for example, variable {2} in the embodiment.

When the rule 1 is applied to FIGS. 6A to 6D, as shown in FIG. 6A, an inner portion surrounded by straight lines passing through a left side of the mask hole 101 and a right side of the mask hole 102 respectively and straight lines passing through a lower side of the lower mask hole 103 and an upper side of the upper mask hole 104 respectively provides a third portion 105. With this, in the extraction region 100, according to the rule 1, a portion inside the extraction region 100 except the third portion 105 is set as variable {0}, a portion of the mask holes 101 and 104 is set as variable {2}, and a remaining portion is set as variable {1}.

According to a rule 2, a first scanning is performed on the extraction region in its X-axis and Y-axis directions, to check portions mutually adjoining on both sides of the variable {1} portion. If, in this case, variable permutations in the variable {1} portion and its adjoining both-sides portions correspond to any one of variable combinations {0}→{1}→{2}, {2}→{1}→{0}, and {0}→{1}→{0} in both cases of X-axial scanning and Y-axial scanning, the variable {1} portion is reset to variable {0}. In this case, the scanning may be performed in either order but if the above-mentioned correspondence is observed only in either X-axial or Y-axial scanning, a relevant variable stays {1} as is.

Figure 6B:
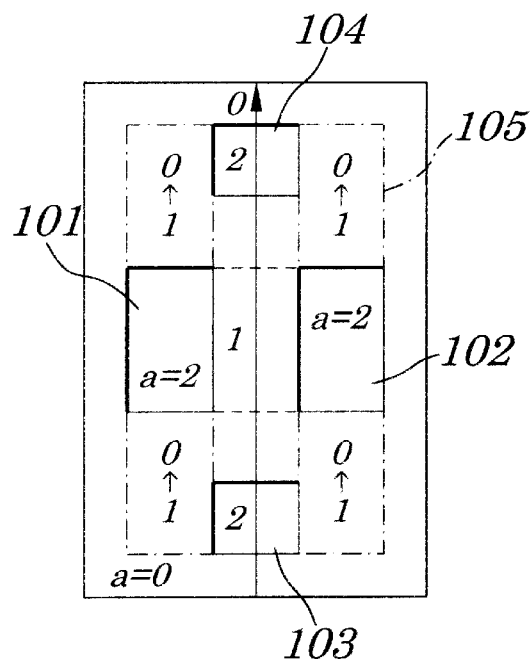

When the rule 2 is applied to FIGS. 6A to 6D, as shown in FIG. 6A, by performing X-axial scanning through the mask hole 101, a variable permutation of {0}→{2}→{1}→{2}→{0} is obtained and by performing X-axial scanning through the lower mask hole 103, on the other hand, a variable permutation of {0}→{2}→{0} is obtained. As a result of X-axial scanning of the extraction region 100, therefore, of the variable {1} portion such a portion is set as variable {0} that excludes a gap portion between the mask holes 101 and 102 where a variable permutation of {2}→{1}→{2} is given in the variable {1} portion and its adjoining both-side portions. Also, as shown in FIG. 6B, as a result of Y-axial scanning to check variable permutations, a gap portion between the lower mask hole 103 and the upper mask hole 104 is set as variable {1} and other portions previously set as variable {1} is reset as variable {0}. With this, only a portion which turned out to be variable {0} in both the X-axial scanning and the Y-axial scanning of the extraction region. 100 performed as above is set as variable {0}, so that the gap portion between the lower mask hole 103 and upper mask hole 104 is set as variable {1} and the other portions which turned out to be variable {1} are set as variable {0}.

According to a third rule, second scanning is performed through the extraction region 100 in its X-axis and Y-axis directions. Any portion of the variable {1} portion which turned out to be of a variable permutation of {0}→{1}→{0} in the variable {1} portion and its adjoining both-side portions in at least one of these scanning operations is reset to variable {0}. Then, this scanning is repeated. That is, third scanning is performed through the extraction region 100 in its X-axis and Y-axis directions, so that the variable {1} portion which turned out to be of a variable permutation of {0}→{1}→{0} in the variable {1} portion and its adjoining both-side portions is reset to variable {0}.

In this case, any portion of the variable {1} portion which turned out to be of a variable permutation of {0}→{1}→{0} in either one of the X-axis and Y-axis directions in the variable {1} portion and its adjoining both-sides portions and of a variable permutation of {2}→{1}→{2} in the other direction is subject to application of a rule 10 by which variable {1} it not reset to {0} but this variable {1} portion is detected as a fourth portion if a ratio of L4/L3 is larger than its predetermined threshold value, where L3 is supposed to be a length of a side of that variable {1} portion which comes in contact with the variable {0} portion and L4, a length of that which comes in contact with the variable {2} portion.

According to the rule 4, the extraction region is finally scanned in both the X-axis and Y-axis directions, so that any portion of the variable {1} portion which turned out to be of a variable permutation of {2}→{1}→{2} in both X-axis and Y-axis scanning operations in the variable {1} portion and its adjoining both-side portions is set as a first portion and any portion of the variable {1} portion which turned out to be of a variable permutation of {2}→{1}→{2} in either of these two directions and of a variable permutation of {2}→{1}→{0} or {0}→{1}→{2} is set as a second portion. Then, an aspect ratio is determined of the variable {1} portion detected as the second portion. The aspect ratio is determined as a value of L2/L1 where L1 is supposed to be a length of, the side of the variable {1} portion which comes in contact with the variable {0} portion and L2 is supposed to be a distance between a straight line passing through this side and a contact point of the variable {1} and variable {2} portions which is perpendicular to this straight line and most distant therefrom, so that if the L2/L1 ratio of smaller than its pre-determined first threshold value, variable {1} of the second portion is reset to variable {0}. With this, fourth, first, and second portions of variable {1} are detected.

In this case, first and second threshold values are provided to check for shortage of mask strength and are arbitrarily set to provide a predetermined strength according to a mask material, a density of mask holes, or a like.

Figure 6C:
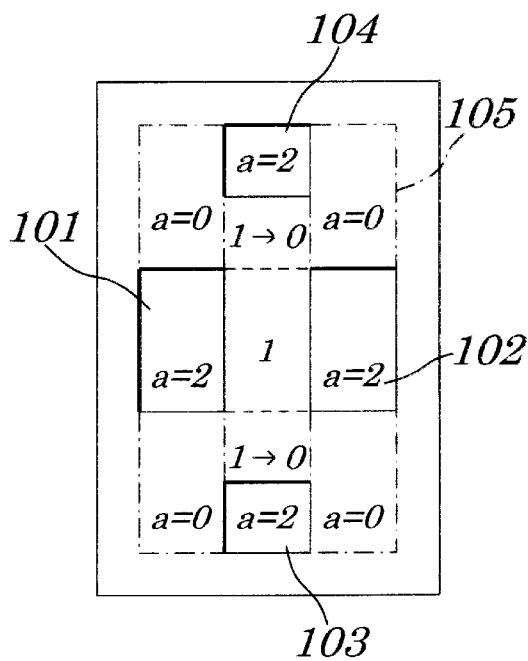

When a rule 3 is applied to FIG. 6B, as shown in FIG. 6C, the second scanning is performed through the extraction region 100 in its X-axis and Y-axis directions. In this case also, scanning may be performed in any order like in the case of the first scanning. For example, if scanning is performed in the Y-axis direction first, that is, if scanning is performed over variable {1} portions, that is, over the lower mask hole 103 and upper mask hole 104, the extracted region 100 has a variable permutation of {0}→{2}→{1}→{2}→{0}, so that this variable {1} portion remains as a portion of variable {1} as is. Next, when scanning is performed over the mask hole 101 in the X-axis direction, in the extraction region 100, a variable {1} portion remains of variable {1}, whereas when scanning is performed through a gap between the mask hole 101 and upper mask hole 104 in the X-axis direction, the variable {1} portion and its adjoining both-side portions have a variable a permutation of {0}→{1}→{0}, so that the variable of the variable {1} portion is reset to variable {0}. Next, the third scanning is performed through the extraction region 100 in its X-axis and Y-axis directions. The third scanning may also be performed in any order like in the cases of the first and second scanning operations. For example, Y-axial scanning is performed over the gap between the mask holes 101 and 102, the extraction region 100 has a variable permutation of {0}→{2}→{0}→{1}→{0}→{2}→{0}, while X-axial scanning over the mask hole 101 causes the extraction region 100 to have a variable permutation of {0}→{2}→{1}→{2}→{0}.

Figure 6D:
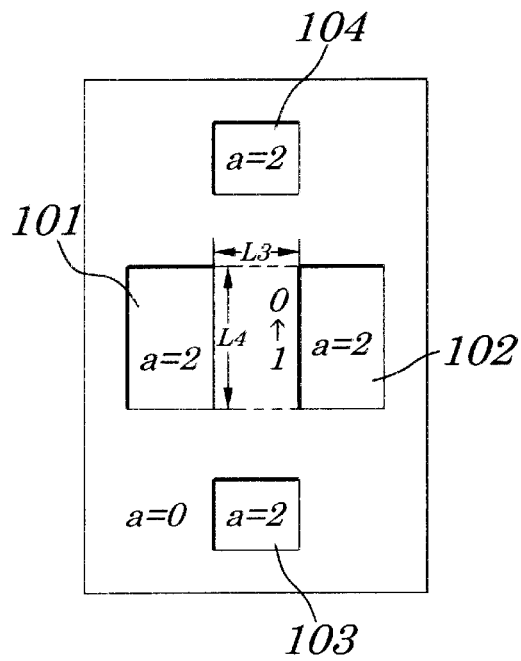

In this case, since the gap portion between the mask holes 101 and 102 has a variable permutation of {2}→{1}→{2} as a result of X-axial scanning and that of {0}→{1}→{0} as a result of Y-axial scanning, the rule 10 is applied. With this, as shown in FIG. 6D, in any variable {1} part of the gap portion between the mask holes 101 and 102, a longer side of the mask hole 101 (or 102) is represented by L4 and width of the gap between the mask holes 101 and 102 is represented by L3, so that if the ratio of L4/L3 is smaller than the predetermined second threshold value, variable {1} can be reset to variable {0}, whereas if the ratio of L4/L3 is larger than the predetermined second threshold value, the variable a stays as {1} as is, so that a relevant portion is detected as a fourth portion which runs short of the mask strength. In the case of the extraction region 100 of this embodiment, the ratio of L4/L3 is set below the second threshold value and, as for the gap portion between the mask holes 101 and 102, variable {1} is reset to variable {0}. With this, any portion except those of variable {2}, that is, except the mask hole 101 and upper mask hole 104 is set to variable {0}.

Then, when the rule 4 is applied, it is found that the extraction region 100 has no variable {1} portions, so that it can be verified that there is present no first or second portion subject to the donut or leaf problem.

Figure 7A:
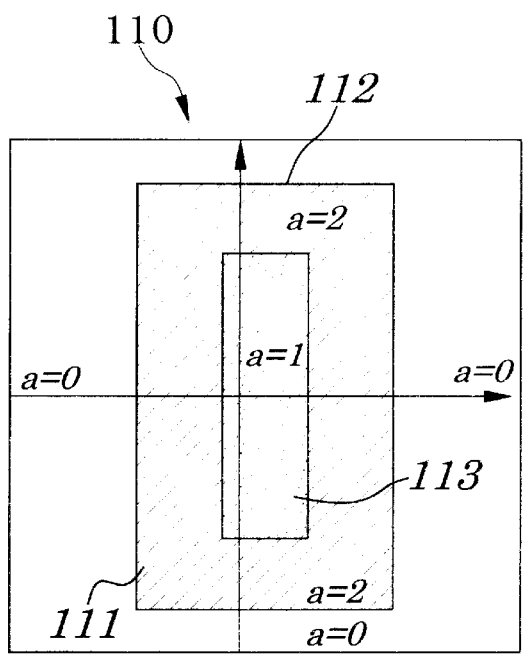
FIGS. 7A, 7B and 7C are schematic top views showing an extraction-subject region including the donut problem-occurrence portion and the leaf problem-occurrence portion.

Next, the extraction region is verified including such portions as subject to the donut or leaf problem. FIG. 7A shows an extraction region 110 having a donut pattern 111 as a mask hole. As shown in FIG. 7A, when the rule 1 is applied to the extraction region 110, the donut pattern 111 and its inner portion provide a third portion 112. With this, any portion inside the extraction region 110 except the third portion 112 is set to variable {0}, the donut pattern 111 is set to variable {2}, and the inner portion 113 of the donut pattern 111 is set to variable {1}. Next, when the first scanning is performed in X-axis and Y-axis directions according to the rule 2, in both directions the inner portion 113 and its adjoining both-side portions turn to be of a variable permutation of {2}→{1}→{2}, thus having no variable changes. Next, the second and third scanning operations are performed, with a result of no portions being changed. Also, there is no portion present subject to application of the rule 10. Then, the final scanning is performed according to the rule 4, with a result that the variable {1} portion can be detected as a first portion subject to the donut problem.

Figure 7B:
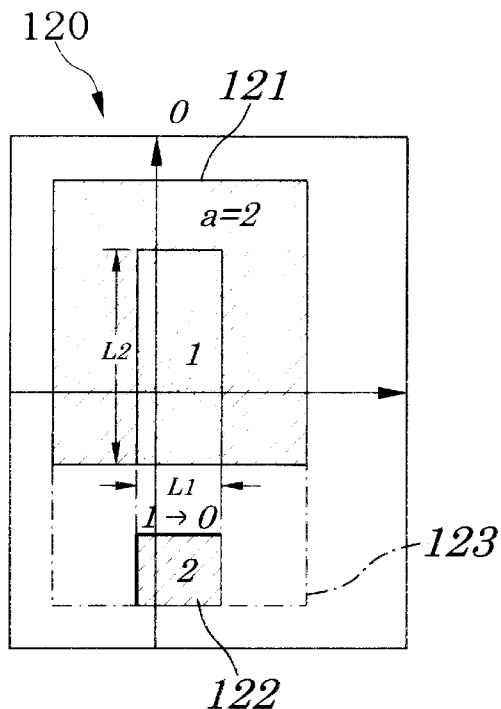

FIG. 7B shows an extraction region 120 having a leaf pattern 121 as a mask hole. As shown in FIG. 7B, the extraction region 120 includes the leaf pattern 121 with no mask hole only at the X-axial lower parts but a square mask hole 122 arranged at the lower part thereof. When the rule 1 is applied to this extraction region 120, a portion surrounded by lines passing through a left side, an upper side, and a right side of the leaf pattern 121 and a line passing through a lower side of the square mask hole 122 provides a third portion 123, thus setting variables according to the rule 1. Next, when the first scanning is performed according to the rule 2, a Y-axial gap portion between the square mask hole 122 and the leaf pattern 121 is set to variable {1}. Next, when the second scanning is performed according to the rule 3, an X-axial gap of the variable {1} portion between the leaf pattern 121 and the square mask hole 122 is set to variable {0} by the X-axial scanning. Next, the third scanning is performed in both X-axis and Y-axis directions, but the variable of the extraction region 120 stays unchanged. Afterward, when the final scanning is performed in both X-axis and Y-axis directions to apply the rule 4, the variable permutation in the variable {1} portion and it sad joining both-side portions turns to be {2}→{1}→{2} as a result of one of these two scanning operations and {0}→{1}→{2} as a result of the other scanning operation. This variable {1} portion is set in such a way that if its aspect ratio L2/L1 is less than a predetermined first threshold value, variable {1} is reset to {0} so that it may not be detected as a leaf problem occurrence portion. With this, only such a portion that has a larger aspect ratio value than the threshold value is detected as the leaf problem occurrence portion.

Figure 7C:
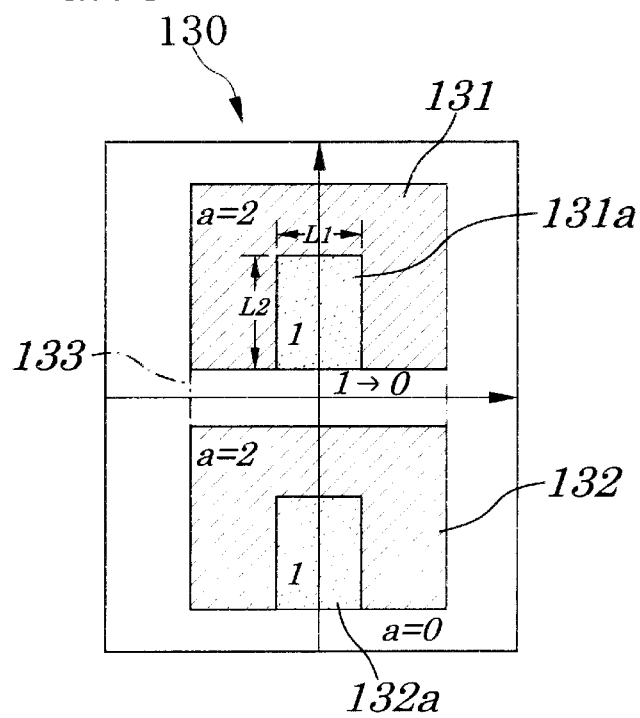

FIG. 7C is a schematic diagram showing an extraction region 130 having two leaf patterns. As shown in FIG. 7C, the extraction region 130 has an upper leaf pattern 131 and a lower leaf pattern 132 having a same shape in the extraction region 130. Neither of respective leaf problem occurrence portions 131a and 132a of the upper leaf pattern 131 and lower leaf pattern 132 has a mask hole formed in the X-axial lower side part. When the rule 1 is applied to this extraction region 130, an inner portion surrounded by straight lines passing through a left side, an upper side, and a right side of the upper leaf pattern 131 and a line passing through the lower side of the lower leaf pattern 132 provides a third portion 133, thus setting variables to the corresponding portions according to the rule 1. When the first scanning is performed in X-axis and Y-axis directions in order to apply the rule 2 to the above-mentioned inner portion, the leaf problem occurrence portion 132a contained in the lower leaf pattern 132 has a variable permutation of {0}→{1}→{2} in the variable {1} portion and its adjoining both-side portions as a result of Y-axial scanning, so that variable {0} is provided. As a result of X-axial scanning, on the other hand, a gap portion between the upper leaf pattern 131 and lower leaf pattern 132, that is, the variable {1} portion and its adjoining both-side portions have a variable permutation of {0}→{1}→{0}, so that variable {0} is provided to the variable {1} portion of this gap portion. In this case, however, even such portion that is provided with variable {0} as a result of one direction of scanning is provided with setting of the variable to {1} as a result of another direction of scanning, so that variables of a portion other than the upper leaf pattern 131 and lower leaf pattern 132 are all set to variable {1}. That is, even when the rule 2 is applied, the variable of each portion is not changed. Next, when the second scanning is performed according to the rule 3, the variable of an X-axial gap portion between the upper leaf pattern 131 and lower leaf pattern 132 is set to {0}, with a result that even when the third scanning is performed, the variable of the extraction region 130 is not changed. When the final scanning is performed to apply the rule 4, the variable {1} portion and its adjoining both-side portions have a variable permutation of {2}→{1}→{2} as a result of the X-axial scanning and {0}→{1}→{2} as a result of the Y-axial scanning, so that the variable is reset based on a value of L2/L1 to decide whether to detect the second portion.

By the first embodiment, when a variable a={0, 1, 2} is set for the extraction region according to the rules 1, 2, and 3 in this order, a portion not subject to pattern defect occurrence has variable {0} at the last stage and the other portions subject to the problem has unchanged variable {1}. Therefore, it is possible to detect as a pattern defect occurrence portion such a portion that has finally been set to variable {1}. It is also possible to use the rule 4 in order to further classify those variable {1} portions subject to a pattern defect into two types of donut problem occurrence portions and leaf problem occurrence portions, thus using the same algorithm to discriminate these two types from each other in detection.

In a variant of the first embodiment, instead of applying the rules 1 through 4 to the extraction region, the rules 5 and the rules 2 through 4 may be applied. By the rule 5, the variable is set without dividing the third portion, thus setting a mask hole in the extraction region to variable {2}, other portions to variable {1}, and the sides of the extraction region to variable {0}. Then, the rules 2 through 4 are applied as in the case of the first embodiment, to set the variables. With this, it is possible to eliminate the step of dividing the third portion.

Second Embodiment

The following will describe a second embodiment of the invention. If a mask hole has a slanted side with respect to a mask portion, performing of X-axial and Y-axial scanning operations alone may not be enough to prevent variable {1} from being set also to a portion not subject to pattern defect occurrence or, conversely, variable {0} from being set to a portion subject to pattern defect occurrence. In this embodiment, by forming a graphic having a constant width in such a manner that it may come in contact with a slanted side of a mask hole, variables a={0}, {1}, {2} are is set like in a case of the first embodiment, so that any variable {1} portion may be detected as a pattern defect occurrence portion. Note here that whether the mask hole has a slanted side or not can be automatically detected beforehand.

Figure 8:
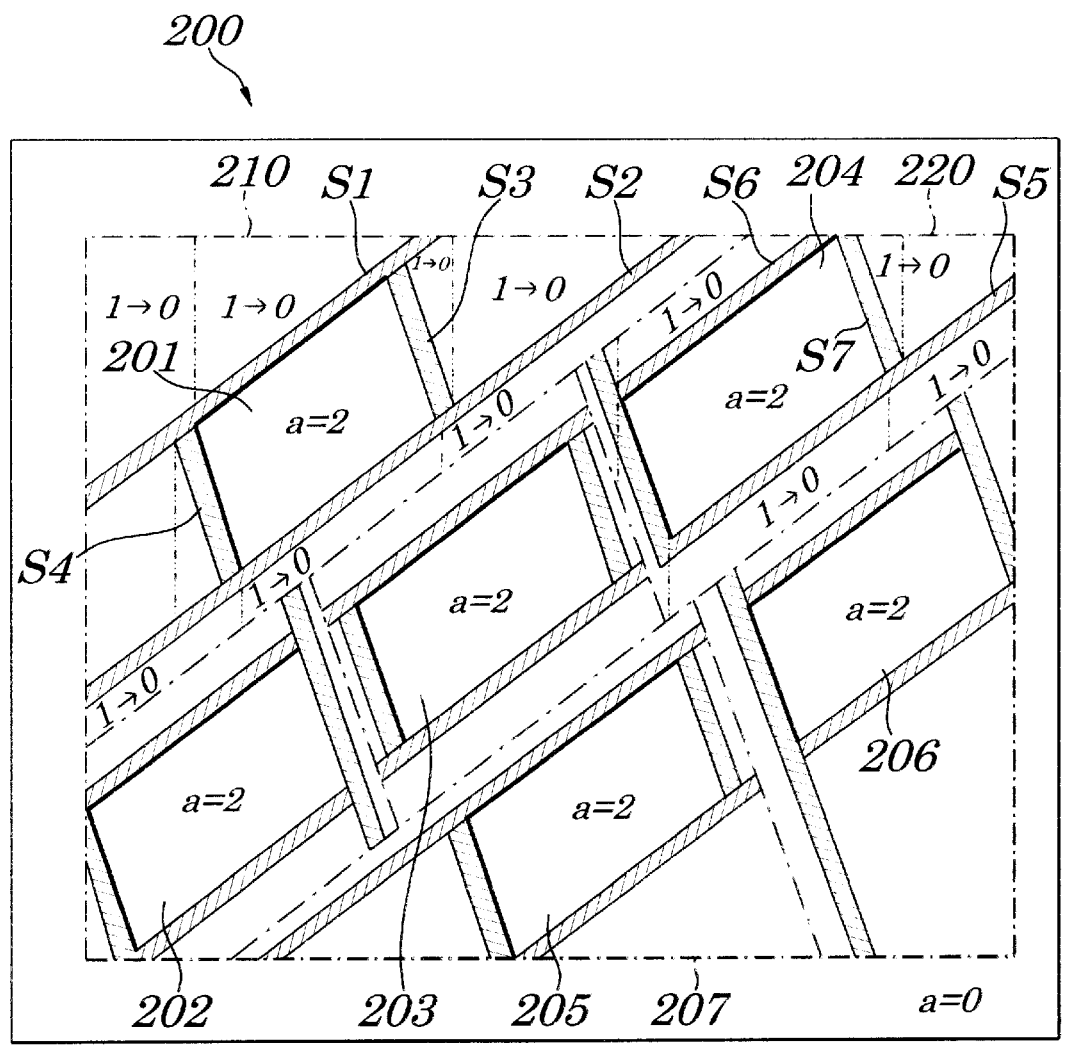
FIG. 8 is a schematic top view showing the extraction-subject region including a mask hole having a slanted side.

In FIG. 8, an extraction region 200 has three rows arranged therein of parallelogram-shaped mask holes (hereinafter called slant patterns) inclined in an upper right direction. The first row includes one slant pattern 201 formed at the upper left corner in the extraction region 200; the second row includes three slant patterns 202, 203, and 204; and the third row includes two slant patterns 205 and 206 formed at the lower right corner in the extraction region 200.

First, like in the case of the first embodiment, rule 1 is applied to this extraction region 200. As shown in FIG. 8, when such a portion is extracted according to the rule 1 that is surrounded by parallel straight lines which are in contact with a slant pattern nearest to the side of the extraction region 200 and also which are parallel to the side of the extraction region 200, this extracted pattern has its upper end in contact with the slant pattern 204, its right end in contact with the slant pattern 206, its lower end in contact with the slant pattern 205, and its left end in contact with the slant pattern 202 and is surrounded by straight lines parallel to respective sides of the extraction region 200. This inner portion is set to a third portion 207, an outside of this third portion 207 is set to variable {10}, a portion within the third portion 207 except the slant patterns formed therein is set to variable {1}, and a portion of the slant pattern 201 or 206 is set to variable {2}.

Next, in contrast to the first embodiment wherein rules 2 through 4 have been applied, in this embodiment, rules 6 through 8 are applied. First, by applying the rule 6, such a variable {1} portion is extracted that is in contact with the variable {0} portion and also that contains a single variable {2} portion. In this case, the variable {1} portion may be extracted from anywhere in the extraction region 200. For example, a portion containing the single variable {2} portion first encountered by scanning clockwise with upper left corner as a starting point, that is, the variable {1} portion having therein a single slant pattern may be extracted.

By applying the rule 7, at thus extracted {1} portion, such a graphic (hereinafter referred to as peripheral graphic) is generated that has a constant width and also that is in contact with a side of a slant pattern which is also the variable {2} portion. In this case, this peripheral graphic is generated in two priority orders. A first priority order relates to positions of opposite ends of the peripheral graphic, whereby a first peripheral graphic having its opposite ends in contact with the variable {0} portion, a second peripheral graphic having its one end in contact with the variable {0} portion and an other end in contact with the first peripheral graphic, and a third peripheral graphic having its opposite ends in contact with the first or second peripheral graphic are generated in this order. Note here that any peripheral graphic in contact with a side of a slant pattern cannot be generated if its opposite ends are not in contact with the variable {0} portion, the first peripheral graphic, or the second peripheral graphic. A second priority order, on an other hand, relates to shape of the first through third peripheral graphics, whereby generation priority is given to such the peripheral graphic that is in contact with the variable {2} portion without having a corner instead of having only one corner to come in contact with it, that is, a quadrilateral shaped peripheral graphic. For example, priority is given to such a quadrilateral slant pattern having one contact side rather than one that has two contact sides. In this embodiment, peripheral graphics encountered earlier with the upper left corner as a starting point are given higher priority orders in generation according to the first and second priority orders. In this case, any peripheral graphic thus generated having its opposite ends in contact with the variable {0} portion is set to variable {0}.

When the rule 6 is applied in FIG. 8, the variable, {1} portion, portion 210, is extracted which has therein a slant pattern 201 arranged at the upper left part in the extraction region 200. When the rule 7 is applied to it, the first peripheral graphic with its opposite ends in contact with the variable {0} portion is generated clockwise with the upper left corner as the starting point. Therefore, as the first peripheral graphic, a peripheral graphic S1 in contact with the upper left side is generated and, next, a peripheral graphic S2 in contact with the lower right side is generated. Next, since there is no second peripheral graphic present which has its one end in contact with the variable {0} portion and the other end in contact with the first peripheral graphic, the third peripheral graphic with its opposite ends in contact with the first or second peripheral graphic is generated clockwise with the upper left side as the starting point, with such a result that a peripheral graphic S3 in contact with the upper right side is generated and also a peripheral graphic S4 in contact with the lower left side is generated. Thus, for each of all the sides of the slant pattern 201, the peripheral graphic having a constant width is generated. When variables are set to these peripheral graphics S1 through S4 in this order, they are all set to variable {0}.

The following will describe the rule 8. After the peripheral graphics are generated, the variable {1} portion is defined by straight lines which are parallel with the X-axis or Y-axis and also which pass through each corner of the variable {2} portion or each corner in contact with the peripheral graphic other than the first through third peripheral graphics. With this, thus defined portion provides a quadrilateral or triangular shape. This defined inner portion is scanned to have a variable set to itself. If it is a quadrilateral, a side in contact with the variable {0} portion is detected, so that if scanning from a middle point of this side to that of a facing side finds that these mutually facing sides are in contact with the variable {0} portion, the variable in that quadrilateral portion is set to {0}. In the case of a triangle, on an other hand, if its two sides or more are in contact with the variable {0} portion, the variable in that triangular portion is set to {0}.

Then, the rules 6 through 8 are applied repeatedly to each of all the variable {2} portions to set variables, to thereby detect any variable {1} portion to be the pattern defect occurrence portion. Then, a rule 9 is applied to scan the variable {1} portion, thereby detecting as the donut problem occurrence fifth portion such a portion that comes in contact with only the variable {2} portion. At the same time, like in the case of the first embodiment, an aspect ratio is obtained of the variable, {1} portion which is in contact with variable {0} portions, that is, the first through third peripheral graphics, so that according to magnitude of thus obtained aspect ratio, the variable of this portion is reset. That is, if the aspect ratio is larger than a predetermined threshold value, this portion is detected as a sixth portion subject to leaf problem occurrence. The aspect ratio can be obtained as L2/L1, where L1 is its side in contact with the variable {0} portion and L2 is a distance between a straight line passing through that side and a contact point of the variable {0} portion and the variable {2} portion most distant from that straight line.

When the rule 8 is applied in FIG. 8, as shown there, the extracted variable {1} portion, portion 210 is divided into triangular portion or quadrilateral portion, variables of all of which are set to variable {0}. Although it has been divided only in the Y-axis direction, X-axial lines may be used in division.

Also, as mentioned above, the rules 6 through 8 are applied to all slant patterns of this extraction region. For example, when the variable {1} portion including the slant pattern is extracted clockwise with the slant pattern 201 as the starting point, then, according to the rule 6, a portion 220 including the slant portion 204 can be extracted. When the rule 7 is applied to this portion 220, it is found that there is no peripheral graphic which has a constant width and which is not in contact with the corner of the slant pattern, of those first peripheral graphics which are in contact with the side of the slant pattern and which have their respective opposite ends in contact with the variable {0} portion. Therefore, a first peripheral graphic S5 having a corner is generated. Next, second peripheral graphics S6 and S7 are generated each of which has its one end in contact with the variable {0} portion and the other end in contact with the first peripheral graphic. Then, these peripheral graphics S5 through S7 are set to variable {0} in this order. Then, the rule 8 is applied, to set all the variable {1} portions to variable {0}. Thus, such portions are extracted which includes the slant patterns 206, 205, 202, and 203, in this order, to which are set variables according to the rules 6 through 8, with a result that there is no variable {1} portion present in the extraction region 200, thus verifying that there is no portions subject to pattern defect occurrence.

Figure 9:
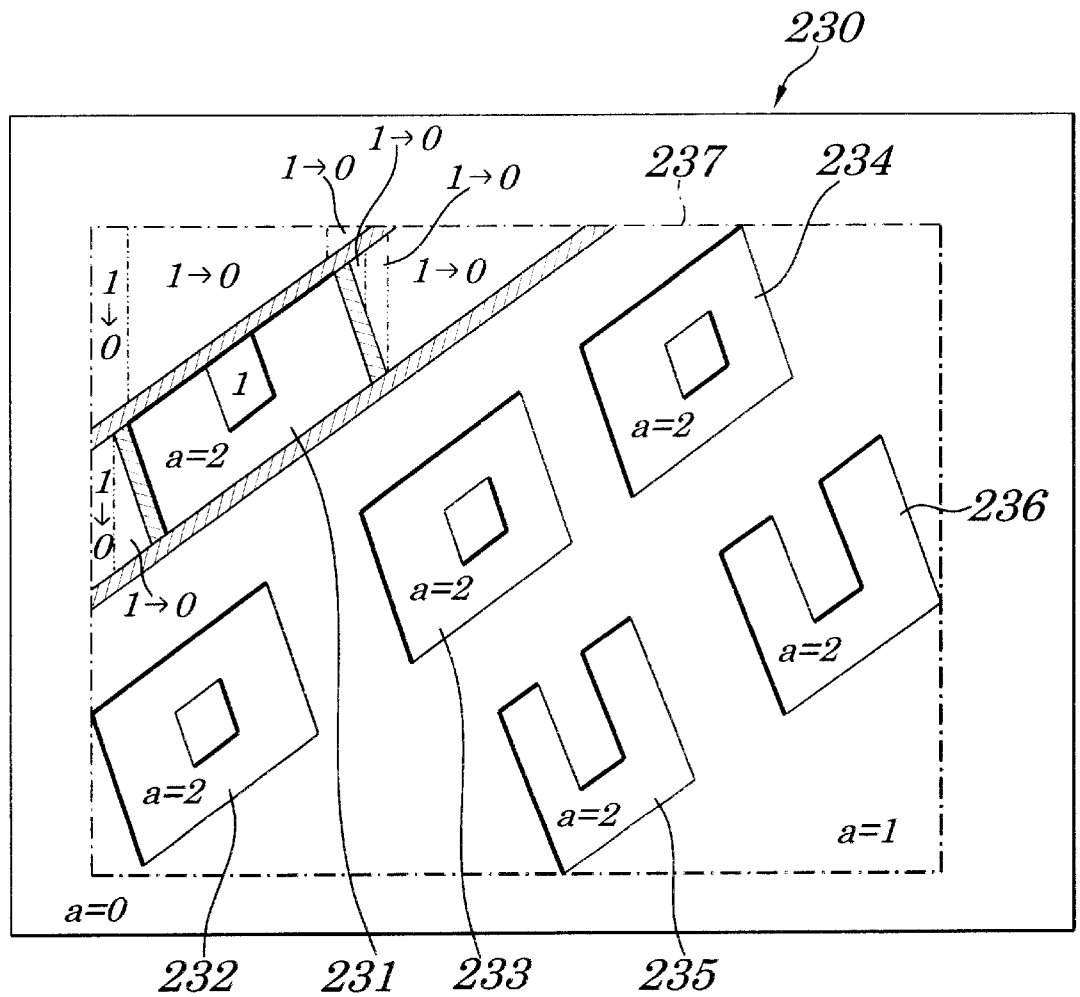
FIG. 9 is a schematic top view showing extraction-subject region in which a slant pattern is formed which includes a pattern defect-occurrence portion.
Figure 10:
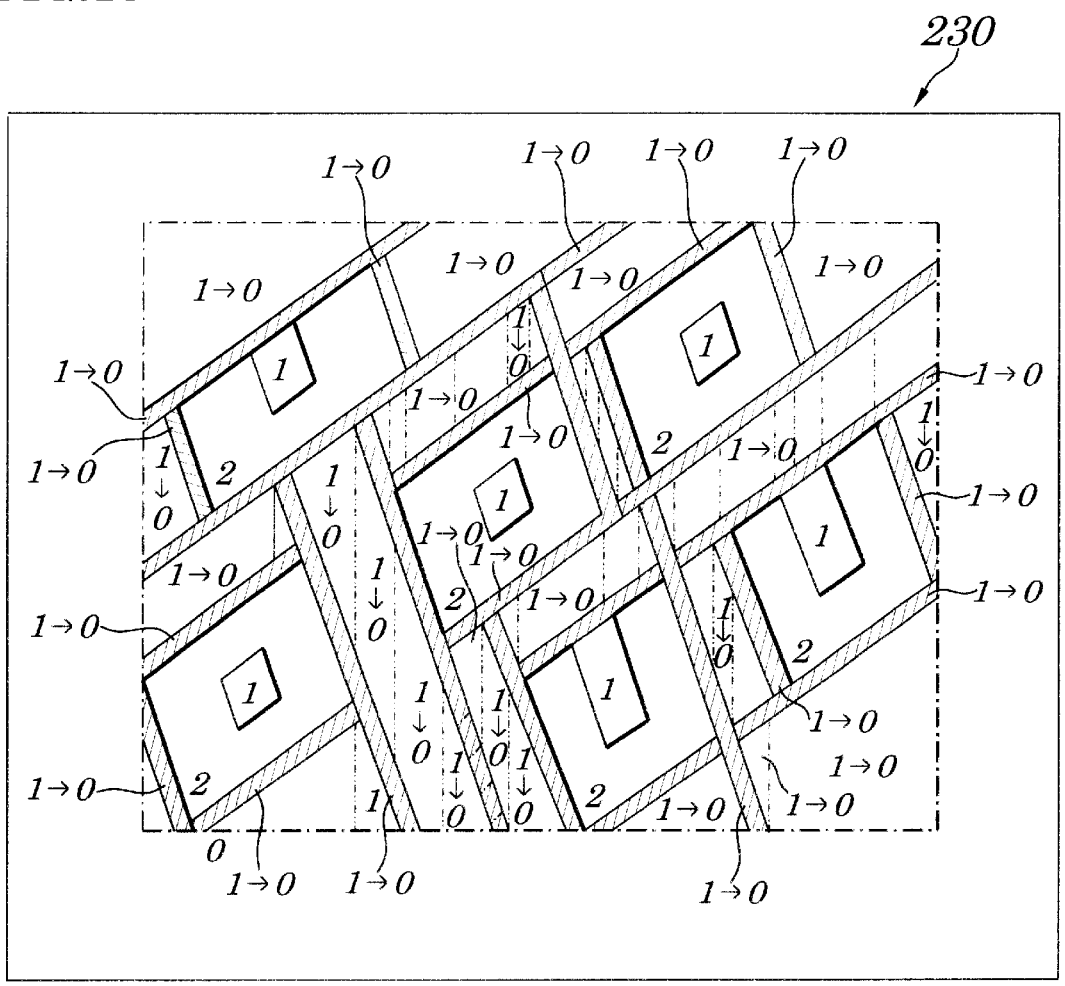
FIG. 10 is another schematic top view showing the extraction-subject region in which the slant pattern is formed which includes the pattern defect-occurrence portion.

FIGS. 9 and 10 are schematic top views showing an extraction region 230 in which are formed slant patterns including a pattern defect occurrence portion. The extraction region. 230 has three rows of mask holes therein in an upper right direction consisting essentially of a first row of a leaf pattern 231 formed to the upper left thereof, a second row of donut patterns 232, 233, and 234, and a third row of leaf patterns 235 and 236. To the extraction region having such patterns, the rules 6 through 8 are applied, for example, as shown in FIG. 9, the rule 1 is first applied to define a third portion 237, thereby setting a variable. Then, a variable {1} portion containing the leaf pattern 231 which is a portion having the upper left variable {2}, to generate first through third peripheral graphics, thus setting a variable a. Then, as shown in FIG. 10, the rules 6 through 8 are applied to all of the mask holes, to set variables. In this case, any portion that has variable {1} is subject to the pattern-defective donut or leaf problem occurrence.

Next, when the rule 9 is applied, inner portions of the donut patterns 232 and 234 are of variable {1} and in contact with only the variable {2} portion, so that they are detected as the donut problem occurrence portion. As for the other variable {1} portions, their L2/L2 value is obtained. Specifically, the side at which the leaf problem occurrence variable {1} portion comes in contact with the variable {0} portion may be rotated so as to be parallel with the X-axis or Y-axis before obtaining the L2/L2 value. If thus obtained L2/L2 value exceeds a predetermined threshold value, a relevant portion is detected as the leaf problem occurrence portion.

Figure 11:
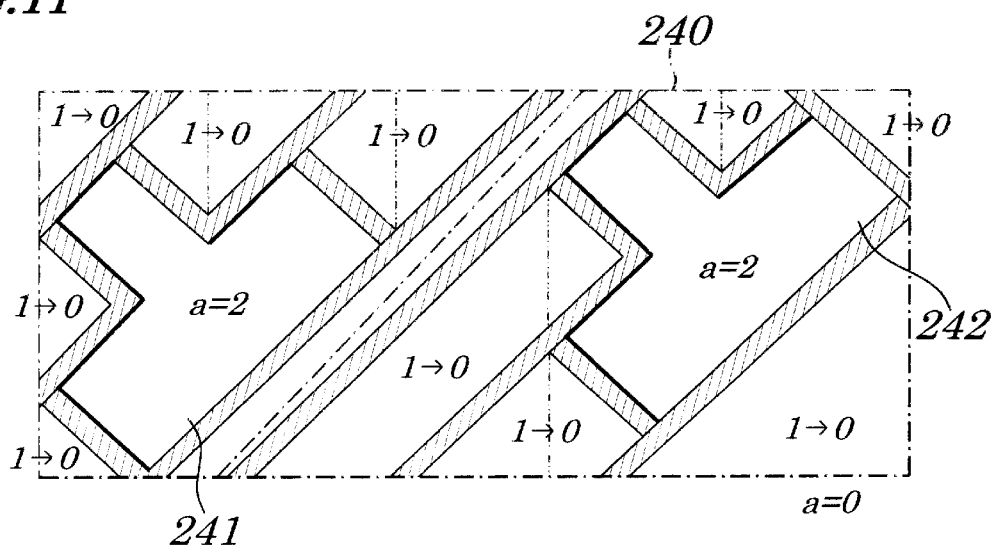
FIG. 11 is a schematic top view showing the extraction-subject region having a convex-shaped mask hole therein.

As shown in FIG. 11, in an extraction region are laterally arranged convex-shaped mask holes 241 and 242 side by side with their bottoms inclined in an upper right direction. FIG. 11 is a schematic diagram indicating a state where the rule 1 has been applied to the extraction region to extract a third portion 240. As shown in FIG. 11, even in a case of such convex-shaped mask holes 241 and 242 arranged obliquely, when the rules 6 through 8 are applied, first through third peripheral graphics in contact with the side of the mask holes 241 and 242 are generated to set variables, with a result that there is no variable {1} portion observed in this portion, thus verifying that there is no portion provided which is subject to pattern defect occurrence.

Figure 12:
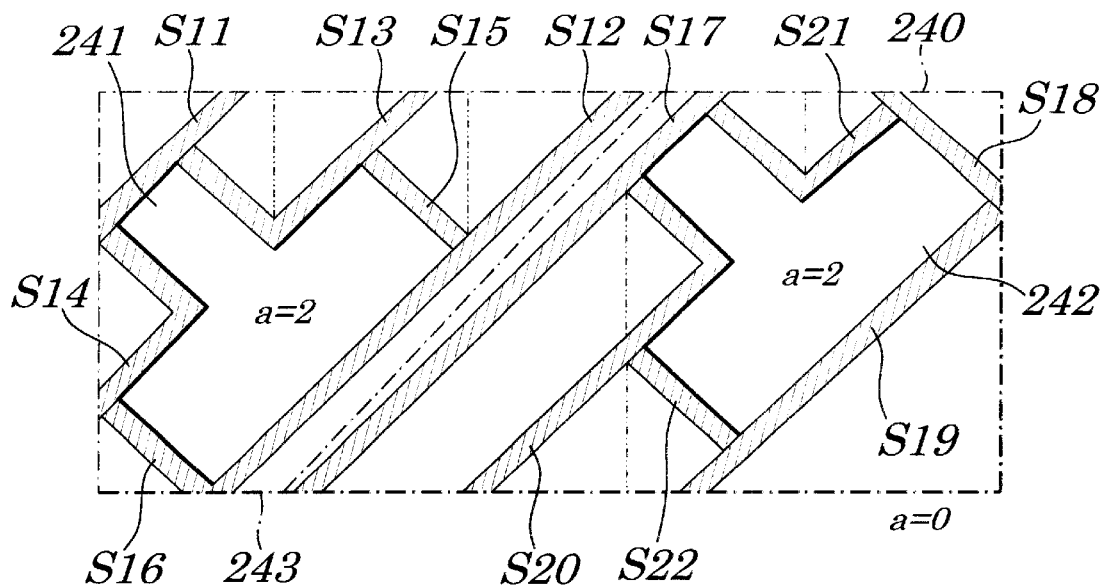
FIG. 12 is schematic top view showing a priority order in which are produced first through third peripheral graphics in the extraction-subject region having the convex-shaped mask hole therein.

The following will describe the first through third peripheral graphics S11 through S16, and S17 through S22 to be generated, with respect to these convex shaped mask holes 241 and 242. As shown in FIG. 12, the rules 6 through 8 are applied starting from convex-shaped the mask hole 241 formed in the left side in the third portion 240. First, a variable {1} portion, portion 243 containing the mask hole 241 is extracted. Then, first peripheral graphics S11 and S12 having their respective opposite ends in contact with the variable {0} portion are preferentially generated along the sides of the mask hole 241 starting from its upper left side clockwise, then, second peripheral graphics S13 and S14 having their respective one end in contact with the variable {0} portion and the other end in contact with the first peripheral graphic S11 are preferentially generated similarly starting from the upper left side clockwise, and then, third peripheral graphics S15 and S16 having their respective opposite ends in contact with the first peripheral graphic S12 and the second peripheral graphic S13 or S14 are preferentially generated similarly starting from the upper left side clockwise. When the first peripheral graphics S11 and S12 of these peripheral graphics are set to variable {0}, the second peripheral graphics S13 and S14 are set to variable {0} and the third peripheral graphics S15 and S16 are also set to variable {0}. Then, when the rule 8 is followed, the variable {1} portion, portion 243 is set to variable {0}. Then, first through third peripheral graphics S17, S18, S19, S20, S21 and S22 are generated with respect to the convex-shaped side mask hole 242 in an order of peripheral graphics S17, S18, and S19 having their respective opposite ends in contact with the variable {0} portion, followed by a peripheral graphic S20 having its one end in contact with the variable {0} and the other end in contact with a peripheral graphic S17 and, finally, peripheral graphics S21 and S22 having their respective opposite ends in contact with peripheral graphics S17, S18 or S19, S20. Then, variables are set to these peripheral graphics and then also to the right side portion.

With the configuration according to the second embodiment, even in the case of a stencil mask having therein a mask hole with a slanted side, a graphic having a constant width can be formed along the side of the mask hole so that an extraction region may be divided according to this graphic to set variable a easily, thus detecting donut problem or leaf problem pattern-defect occurrence portions with the same algorithm. Also, like in the case of the first embodiment, based on magnitude of aspect ratio of a potential leaf problem occurrence portion, whether to detect this portion as a leaf problem occurrence portion can be determined.

Figure 13:
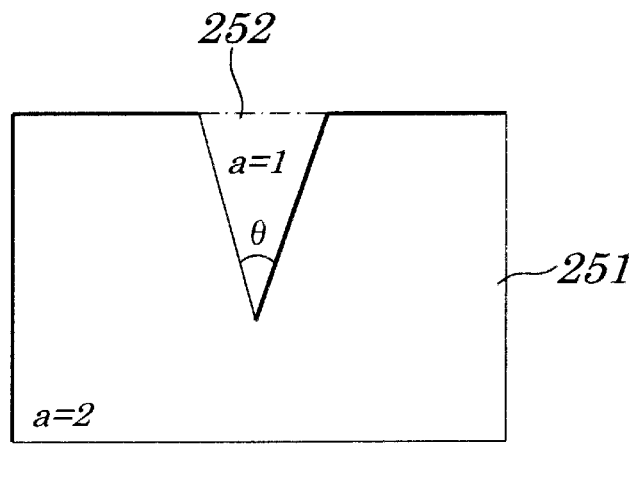
FIG. 13 is a schematic top view showing the extraction-subject region including a triangular leaf problem-occurrence portion.

The following will describe a variant of the second embodiment. In the second embodiment, according to the rule 7, the first through third peripheral graphics can each have one corner only in such a way that the peripheral graphics generated by the rule 7 may only be in contact with a side of the variable {2} portion without a corner or with one corner, so that if the angle between the corner and the variable {2} portion is less than 270°, it is possible also to detect leaf problem occurrence triangular portions. As shown in FIG. 13, a mask hole 251 has therein a leaf problem occurrence, triangular portion 252 having an acute angle θ. Although the first through third peripheral graphics can each have one corner when the variable {1} portion containing this mask hole 251 is extracted, that corner provides an angle of 270° or larger between the peripheral graphic and the mask hole 251, so that no peripheral graphics are generated at a side along the acute angle θ of the triangular portion 252 formed in the mask hole 251. Therefore, the variable of triangular portion 252 is not set to variable {0}, thus making it possible to detect leaf problem occurrence triangular portions.

Although the above-mentioned first embodiment and second embodiment have employed the stencil mask for use in electron beam exposure, even the stencil mask for use in ion beam projection lithography may be used to detect donut problem or leaf problem occurrence sites using a similar method.

It is thus apparent that the present invention is not limited to the above embodiments but may be changed and modified without departing from the scope and spirit of the invention.

What is claimed is:

1. A drawing pattern verifying method for verifying a drawing pattern to be formed on a stencil mask used in electron beam exposure or ion beam exposure, comprising steps of:

extracting said drawing pattern from device designing data;

dividing a region in which said extracted drawing pattern is arranged except mask holes into a plurality of portions;

setting to each of divided said portions a variable of a plurality of kinds of variables which are determined based on likelihood of defectiveness of said portions; and reviewing a specific variable of a portion based on likelihood of defectiveness thereof.

2. The drawing pattern verifying method according to claim 1, wherein: said reviewing step comprises steps of:
further dividing a portion with said specific variable into a plurality of portions; and
setting to each of said portions a variable which is determined based on likelihood of defectiveness thereof; and said further dividing step and said setting step are repeated once or a plurality of times.

3. The drawing pattern verifying method according to claim 1, wherein a portion of a finally set specific variable is a first defective portion entirely surrounded by mask holes and/or a second defective portion partially surrounded by mask holes.

4. The drawing pattern verifying method according to claim 1, wherein: said variable setting step specifically sets variables a={a0}, {a1}, {a2} (where, a0≠a1≠a2) according to rules, said rules comprising:
a first rule for setting to a third portion an inner portion surrounded by straight lines which are in contact with a mask hole nearest to a region arranged in said drawing pattern and which are parallel with sides of said region and also setting an outside of said third portion to variable {a0}, mask holes to variable {a2}, and remaining to variable {a1};
a second rule for performing first scanning on said region in X-axis and Y-axis directions, to set said to variable {a0} such a portion of said variable {a1} that becomes of any selected one of variable permutations of {a0}→{a1}→{a2}, {a2}→{a1}→{a0}, and {a0}→{a1}→{a0} observed in said portion of said variable {a1} and adjoining both-side portions thereof as a result of scanning in both directions; and
a third rule for performing second scanning on said region in X-axis and Y-axis directions, to set to said variable {a0} such a portion of said variable {a1} that becomes of a variable permutation of {a0}→{a1}→{a0} observed in said portion of said variable {a1} and adjoining both-side portions thereof as a result scanning in one or both of X-axis and Y-axis directions, and then performing third scanning in X-axis and Y-axis directions for setting in a same way as said second scanning; and
said specific variable is {a1}.

5. The drawing pattern verifying method according to claim 1, wherein: said variable setting step specifically sets variables a={a0}, {a1}, {a2} according to rules, said rules comprising:
a fifth rule for setting sides of a region in which said drawing pattern is arranged to variable {a0}, mask holes to variable {a2}, and remaining to variable {a1};
said second rule for performing first scanning on said region in X-axis and Y-axis directions, to set to said variable {a0} such a portion of said variable {a1} that becomes any selected one of variable permutations of {a0}→{a1}→{a2}, {a2}→{a1}→{a0}, and {a0}→{a1}→{a0} observed in said portion of said variable {a1} and adjoining both-side portions thereof as a result of scanning in both directions; and
said third rule for performing second scanning on said region in X-axis and Y-axis directions, to set to said variable {a0} such a portion of said variable {a1} that becomes of a variable permutation of {a0}→{a1}→{a0} observed in said portion of said variable {a1} and adjoining both-side portions thereof as a result of scanning in one or both of X-axis and Y-axis directions, and then performing third scanning in X-axis and Y-axis directions for setting variables in the same way as said second scanning; and
said specific variable is {a1}.

6. The drawing pattern verifying method according to claim 4, wherein said rules further comprise:
a fourth rule for, after said third rule is applied, performing final scanning in X-axis and Y-axis directions, to detect as a first defective portion such a portion of said variable {a1} that becomes of a variable permutation of {a2}→{a1}→{a2} observed in said portion of said variable {a1} and adjoining both-side portions thereof as a result of scanning in both directions and to detect as a second defective portion such a portion of said variable {a1} that becomes of a said variable permutation of {a2}→{a1}→{a2}, observed in said portion of said variable {a1} and adjoining both-side portions, as a result of scanning in either one of X-axis and Y-axis directions and of {a0}→{a1}→{a2} or {a2}→{a1}→{a0} as a result of scanning in the other direction, thus detecting said portion of said variable {a1} as said first defective portion or said second defective portion.

7. The drawing pattern verifying method according to claim 6, wherein when an aspect ratio of said second defective portion is smaller than a first threshold value, variable a of said second defective portion is reset from {a1} to {a0}.

8. The drawing pattern verifying method according to claim 7, wherein said aspect ratio of said second defective portion is a magnitude of L2/L1, where L1 represents a length of such a side of said second defective portion that is in contact with a portion of variable {a0} and L2 represents a distance between a straight line passing through said side and a contact point, which is the most distant in a direction perpendicular to said straight line, of said second defective portion and said portion of said variable {a2}.

9. The drawing pattern verifying method according to claim 4, wherein by said second and third rules, a portion of said variable {a1} which becomes of a variable permutation of {a0}→{a1}→{a0}, observed in said portion of said variable {a1} and adjoining both-side portions thereof, as a result of scanning in either of X-axis and Y-axis directions and of a said variable permutation of {a2}→{a1}→{a2} as a result of scanning in the other direction remains as of said variable {a1} and is detected as a fourth defective portion if a value of L4/L3 is larger than a second threshold value, where L4 represents a length of a side of said portion of said variable {a1} that is in contact with variable {a2} and L3 represents a length of a side of said portion of variable {a1} that is in contact with said variable {a0}.

10. The drawing pattern verifying method according to claim 1, wherein: said variable setting step specifically sets variables a={a0}, {a1}, {a2} according to rules, said rules comprising:
said first rule for setting to a third portion such a portion that is surrounded by straight lines which are in contact with a mask hole nearest to a side of a region in which said drawing pattern is arranged and which are parallel with sides of said region and also setting a portion outside said third portion to variable {a0}, mask holes to variable {a2}, and remaining to variable {a1};
a sexth rule for extracting a portion of said variable {a1} which is in contact with a portion of said variable {a0} and which contains a single portion of said variable {a2};

a seventh rule for forming a graphic which is in contact with a side of said portion of said variable {a2} and which has a predetermined width, thus setting a variable for said graphic; and an eighth rule for dividing variables of said extracted portion of said variable {a1} based on said graphic, thus setting variables; and said specific variable is {a1}.

11. The drawing pattern verifying method according to claim 10, wherein said sixth, seventh and eighth rules are performed as many as a number of said variable {a2} provided.

12. The drawing pattern verifying method according to claim 10, wherein a graphic formed according to said seventh rule is specifically formed in a priority order of a first graphic which is in contact with said portion of said variable {a2}, which has a predetermined width, and which has opposite ends thereof in contact with said portion of said variable {a0}, a second graphic which is in contact with a side of said portion of said variable {a2}, which has a predetermined width, and which has one end thereof in contact with said portion of said variable {a0} and the other end thereof in contact with said first graphic, and a third graphic which is in contact with a side of said portion of said variable {a2}, which has a predetermined width, and which has opposite ends thereof in contact with said first graphic or said second graphic.

13. The drawing pattern verifying method according to claim 12, wherein said first through third graphics formed are only such graphics that are in contact with a side of said portion of said variable {a2} without a corner thereof or that are in contact with a side of said portion of said variable {a2} with one corner thereof, said graphics without a corner thereof having priority over said graphics with a corner in formation.

14. The drawing pattern verifying method according to claim 13, wherein an angle of said corner of said first through third graphics with respect to a portion of said variable {a2} is less than 270°.

15. The drawing pattern verifying method according to claim 9, further comprising a ninth rule for detecting a portion of said variable {a1} which is in contact with none of said first through third graphics as a fifth region and a portion of said variable {a1} which is in contact with any one of said first through third graphics as a sixth region, thus detecting portions of said variable {a1} as a fifth portion or a sixth portion.

16. The drawing pattern verifying method according to claim 15, wherein said variable {a1} is reset to said variable {a0} if an aspect ratio of said sixth portion is less than a third threshold value.

17. The drawing pattern verifying method according to claim 16, wherein said aspect ratio of said sixth portion is given as L6/L5, where L5 represents a length of a side of said sixth portion which is in contact with any one of said first to third graphics and L6 represents a length of a distance between a straight line passing through said side and a contact point, which is the most distance from said straight line in a direction perpendicular thereto, of a portion of said variable {a1} and a portion of said variable {a2}.

* * * * *